United States Patent
Bohr

(10) Patent No.: US 6,362,074 B2
(45) Date of Patent: *Mar. 26, 2002

(54) INTEGRATED CIRCUIT PROCESSING WITH IMPROVED GATE ELECTRODE FABRICATION

(75) Inventor: Mark Bohr, Aloha, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/223,078

(22) Filed: Dec. 29, 1998

Related U.S. Application Data

(62) Division of application No. 09/691,932, filed on Oct. 19, 2000, which is a division of application No. 09/223,078, filed on Dec. 29, 1998.

(51) Int. Cl.$^7$ .......................................... H01L 21/8238
(52) U.S. Cl. ....................... 438/424; 438/296; 438/585; 438/719; 438/926; 438/221
(58) Field of Search ................................. 438/221, 296, 438/424, 926, 719, 585, 669, FOR 227, FOR 131, FOR 393, FOR 347

(56) References Cited

U.S. PATENT DOCUMENTS

| | | | | |
|---|---|---|---|---|
| 5,763,309 A | * | 6/1998 | Chang | |
| 5,923,992 A | * | 7/1999 | Spikes et al. | |
| 5,966,615 A | * | 10/1999 | Fazan et al. | |
| 5,981,356 A | * | 11/1999 | Hsueh et al. | |
| 6,022,781 A | * | 2/2000 | Noble, Jr. et al. | |
| 6,093,593 A | * | 7/2000 | Jang | |
| 6,133,114 A | * | 10/2000 | Lu et al. | |
| 6,146,970 A | * | 11/2000 | Witek et al. | |

OTHER PUBLICATIONS

Wolf, S. et al., Silicon Processing For The VLSI Era, vol. 1, Wolf, 1986 by Lattice Press, pp. 565–568.*

* cited by examiner

*Primary Examiner*—George Fourson
*Assistant Examiner*—Michelle Estrada
(74) *Attorney, Agent, or Firm*—Schwegman, Lundberg, Woessner & Kluth, P.A.

(57) ABSTRACT

An integrated circuit is fabricated with a layer of polysilicon located on top of shallow trench regions. The polysilicon is patterned so that the trench features are not exposed during an etching operation performed on the polysilicon layer. The process of fabricating transistor gate electrodes, therefore, is improved by reducing etch byproducts contributed by the shallow trench region features.

18 Claims, 4 Drawing Sheets

INTEGRATED CIRCUIT PROCESSING WITH IMPROVED GATE ELECTRODE FABRICATION

RELATED INVENTION

The present invention is related to the following invention which is assigned to the same assignee as the present invention:

Ser. No. 09/691,932, filed Oct. 19, 2000 entitled "Integrated Circuit Processing Having Dummy Features", which is a divisional of the present invention, which is a Div of Ser. No. 09/223,078, filed Dec. 29, 1998.

TECHNICAL FIELD

The present invention relates generally to integrated circuit fabrication and in particular the present invention relates to improving gate electrode fabrication by reducing etch byproducts contributed by shallow trench region features.

BACKGROUND

Integrated circuits contain thousands, if not millions, of individual structures fabricated on individual die which are fabricated on a common wafer. The dies are subsequently separated during processing. The structures fabricated on each individual integrated circuit die are located across the die as dictated by their relationship to other structures on the die. That is, two circuit structures which are connected electrically will preferably be located in relative proximity to each other. It will be appreciated, that physical open areas will exist between some structures when a layout of the integrated circuit to die is complete. To maintain a uniform density across the die, and the integrated circuit wafer, dummy structures, such as dummy active areas and dummy polysilicon lines, can be placed in the open areas. These dummy structures are not operative, but provide benefits during processing. For example, dummy structures can be located throughout an integrated circuit to improve planarization during chemical mechanical polishing (CMP) of subsequent dielectric layers. These structures are important to help maintain a uniform pressure across the wafer during CMP processing. During subsequent fabrication operations, the dummy structures are typically ignored.

Many operations performed while fabricating an integrated circuit depend upon variables measured during fabrication. One such operation is a bulk etch process performed on a layer of polysilicon used to fabricate transistor gates. The etch process removes undesired polysilicon, but can remove gate oxide located beneath the polysilicon layer. To fully remove the undesired polysilicon, without removing gate oxide, a byproduct of the etching process is chemically monitored to determine when the gate oxide is reached. Thus, a clear chemical transition is desired to be provided to improve the end point of the polysilicon etch. For the reasons stated above, and for other reasons stated below which will become apparent to those skilled in the art upon reading and understanding the present specification, there is a need in the art for an improved polysilicon etch process which has a clear end point.

SUMMARY OF THE INVENTION

The above mentioned problems with integrated circuit fabrication and other problems are addressed by the present invention and will be understood by reading and studying the following specification.

In particular, one embodiment of the present invention describes an integrated circuit comprising shallow trench region features formed of an insulator material, gate oxide regions, and polysilicon regions located on top of the gate oxide regions and the shallow trench region features. The polysilicon regions are formed from a layer of polysilicon which has been etched to form transistor gate electrodes on top of the gate oxide regions and form the polysilicon over the shallow trench region features.

In another embodiment, a method of forming transistor gate electrodes is described. The method comprises fabricating shallow trench region features in a substrate, fabricating a layer of gate oxide over the substrate, fabricating a layer of polysilicon over the layer of gate oxide, and selectively removing portions of the layer of polysilicon. Portions of the polysilicon material remain over the layer of gate oxide to form the transistor gate electrodes, and polysilicon material remains over the shallow trench region features.

In yet another embodiment, a method of fabricating an integrated circuit is provided. The method comprises fabricating a plurality of shallow trench region features in a substrate, fabricating a layer of oxide over the substrate, and fabricating a layer of polysilicon over the layer of oxide and the plurality of shallow trench region features. The method also comprises selectively etching portions of the layer of polysilicon such that polysilicon material remains over the plurality of shallow trench region features, monitoring byproducts during the etch, and terminating the etch based upon a composition of the byproducts during the etch.

DETAILED DESCRIPTION

Figure 1:
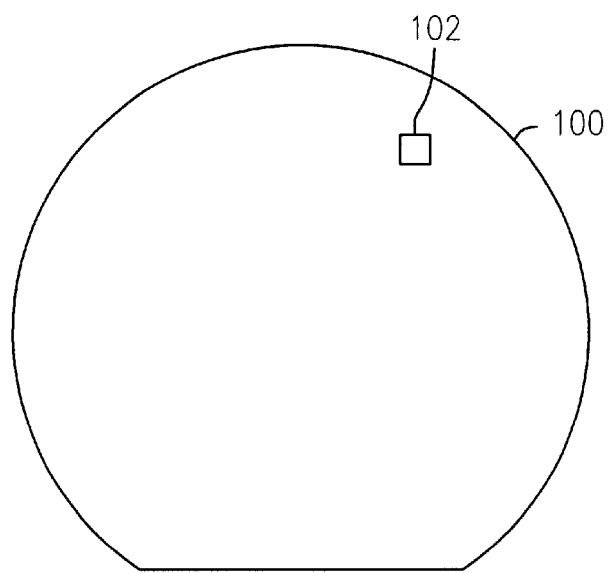
FIG. 1 illustrates a prior art integrated circuit wafer.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The term "horizontal" as used in this application is defined as a plane parallel to the conventional plane or surface of a wafer or substrate, regardless of the orientation of the wafer or substrate. The term "vertical" refers to a direction perpendicular to the horizonal as defined above. Prepositions, such as "on," "side" (as in "sidewall"), "higher", "lower," "over" and "under" are defined with respect to the conventional plane or surface being on the top surface of the wafer or substrate, regardless of the orientation of the wafer or substrate.

Figure 2:
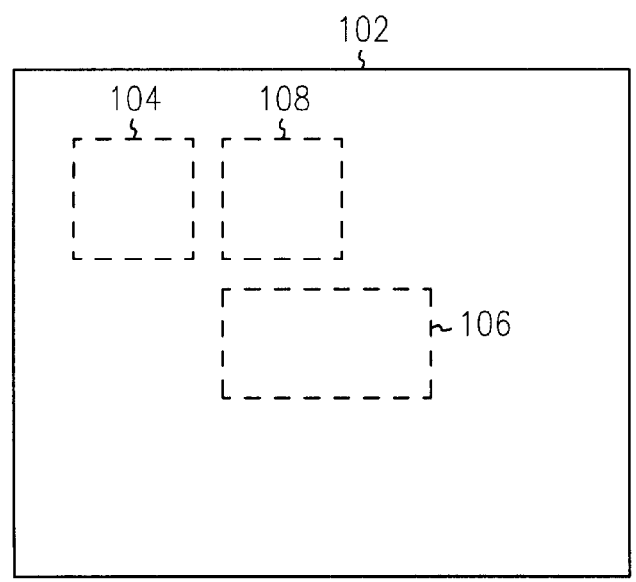
FIG. 2 illustrates a general diagram of a prior art integrated circuit.

FIG. 1 illustrates a top view of a prior art integrated circuit wafer 100. The wafer 100 comprises hundreds of integrated circuit die 102 which are intended to be separated and individually packaged to provide specific operating features, such as processors, memories, and application specific integrated circuits (ASIC). As known to those skilled in the art, integrated circuits have thousands of applications and are not limited to those described herein. A very simplified top view of a prior art individual integrated circuit die 102 is shown in FIG. 2. The integrated circuit die 102 has regions 104 and 106 containing active circuit structures, and intermediate regions 108 which do not contain active circuit structures. To maintain a substantially uniform density across the die 102, dummy circuit structures are fabricated in the intermediate regions 108.

Figure 3A:
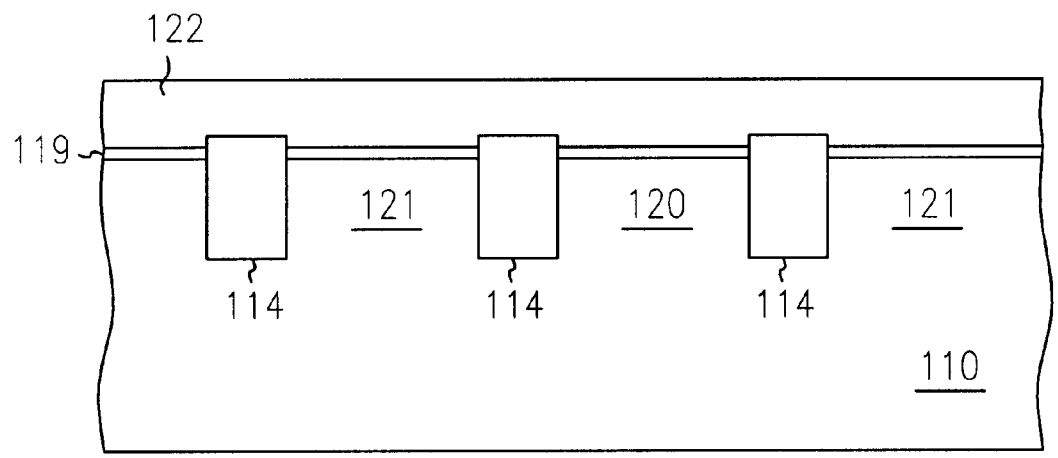
FIGS. 3A–B are cross sections of a prior art integrated circuit having exposed shallow trench region features.
Figure 3B:
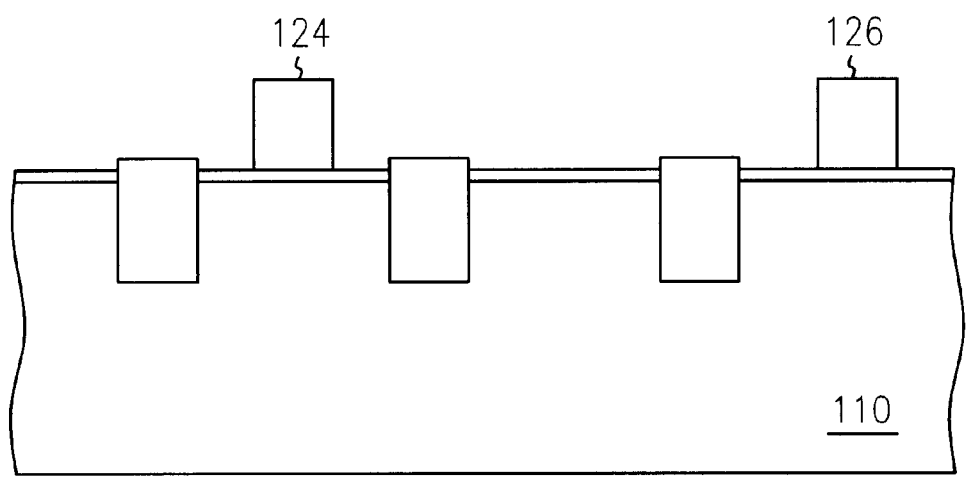

FIGS. 3A–B illustrate cross sections of a prior art integrated circuit including dummy active area features. Referring to FIG. 3A, a substrate 110 is fabricated with shallow trench regions (STR) 114 which contain an insulator, such as oxide, to laterally isolate active areas 120 and 121 formed in the substrate. It will be understood that circuit designers layout active areas 121 for fabricating transistors and other active circuitry. To provide a more uniform integrated circuit die, dummy active areas 120 are located throughout the die in areas which do not contain transistors or other active circuitry. As a result, shallow trench regions 114 are fabricated between the active areas 121 and dummy active areas 120. A thin layer of gate oxide 119 is fabricated on a top surface of the substrate active areas, and a layer of polysilicon 122 is fabricated on the gate oxide and trench region features. Layer 122 can be fabricated from other semiconductive or conductive materials, such as, but not limited, to tungsten and tantalum compositions, and is not limited to polysilicon. During subsequent processing shown in FIG. 3B, the polysilicon layer 122 is patterned and etched to define polysilicon gate electrodes 124 and 126 for transistor fabrication. It will be appreciated by those skilled in the art, that the polysilicon layer 122 can be used to fabricate additional interconnects and is not limited to gate electrodes.

Figure 3C:
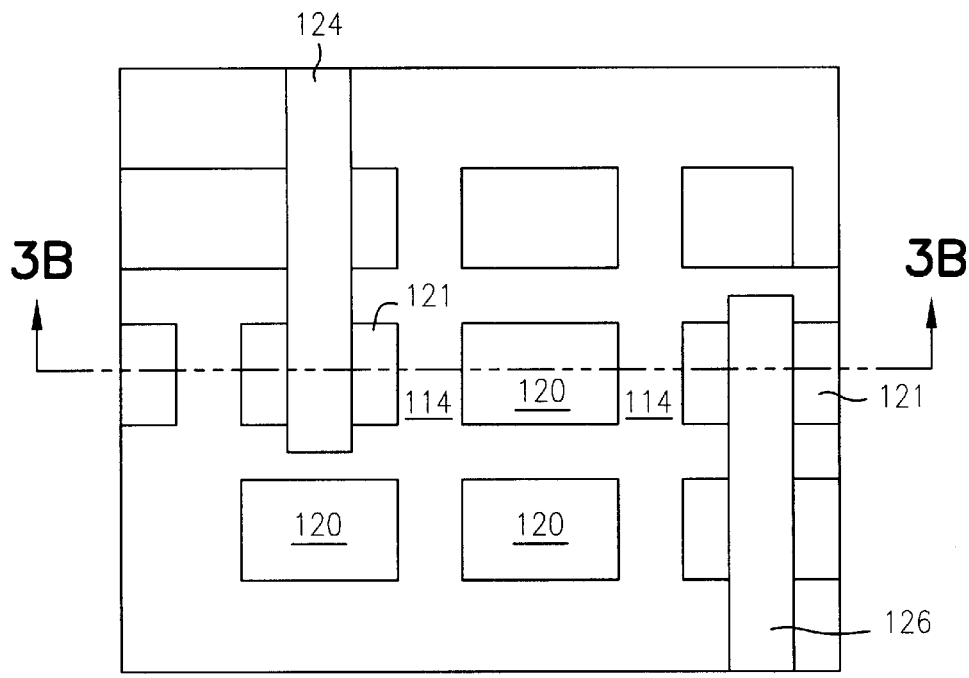
FIG. 3C is a plan view of the integrated circuit of FIG. 3B.

As stated above, the goal in etching the polysilicon layer 122 is to remove all undesired polysilicon without removing substantial amounts of gate oxide 119. As such, the etch process duration is variable and terminated when the etch byproducts (material removed from the integrated circuit) contain less silicon. Because the shallow trench regions 114 can extend vertically above the gate oxide layer 11 9, portions of the shallow trench regions are etched during the polysilicon etch process. Thus, the polysilicon etch end point signal, determined by the chemical composition of the removed material, is not clear as a result of the shallow trench region features. To ensure that all of the undesired polysilicon is removed, the etch process is continued for a predetermined time after the shallow trench region features are reached. Because the height of features 114 can vary, over etch conditions can occur and damage the gate oxide layer. See FIG. 3C for a plan view of the integrated circuit die of FIG. 3B illustrating the shallow trench regions, active area/gate oxide regions, and polysilicon gates. It will be appreciated that a substantial percent of the area exposed during the polysilicon etch process includes the shallow trench regions.

Figure 4C:
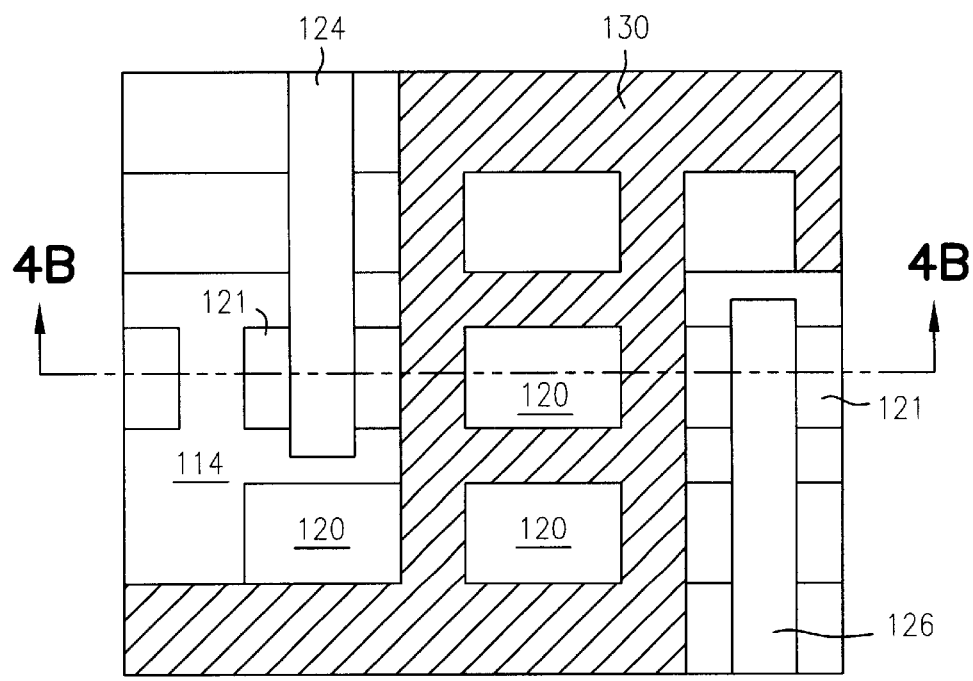
FIG. 4C is a plan view of the integrated circuit of FIG. 4B.
Figure 4A:
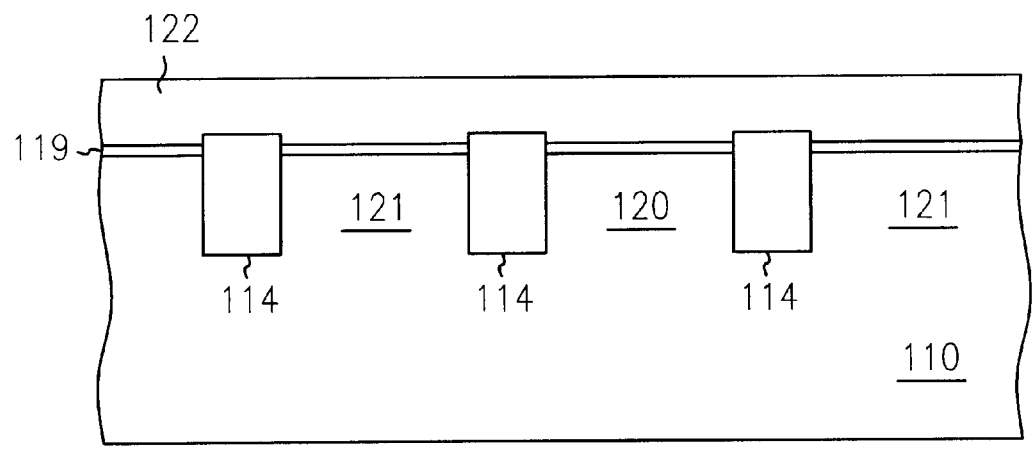
FIGS. 4A–B are cross sections of an integrated circuit having polysilicon remaining on shallow trench region features in accordance with an embodiment of the present invention.

Referring to FIGS. 4A and B, cross sections of an integrated circuit are described. The integrated circuit fabricated in accordance with an embodiment of the present invention includes a substrate 110 having shallow trench regions 114 fabricated therein to laterally separate active areas 120 and 121 formed in the substrate. The integrated circuit also includes an oxide layer 119, formed over the active areas, which is used to form gate oxide for transistor fabrication. A layer of polysilicon 122 is provided over the gate oxide and used to form transistor gate electrodes 124 and 126 and other electrical interconnects. The processes followed in FIG. 4A are similar to those described for FIG. 3A. It will be understood that standard masking processes may be used. For example, a photoresist layer is provided on the integrated circuit and selectively exposed (patterned) using a polysilicon etch mask. The exposed photo resist regions are removed by a develop step (chemical etch). The unexposed photoresist remains and its pattern is transferred into the underlying polysilicon layer by a polysilicon etch step to define gate electrodes. The unexposed photoresist remains and its pattern is transferred into the underlying polysilicon layer by a polysilicon etch step to define gate electrodes.

Figure 4B:
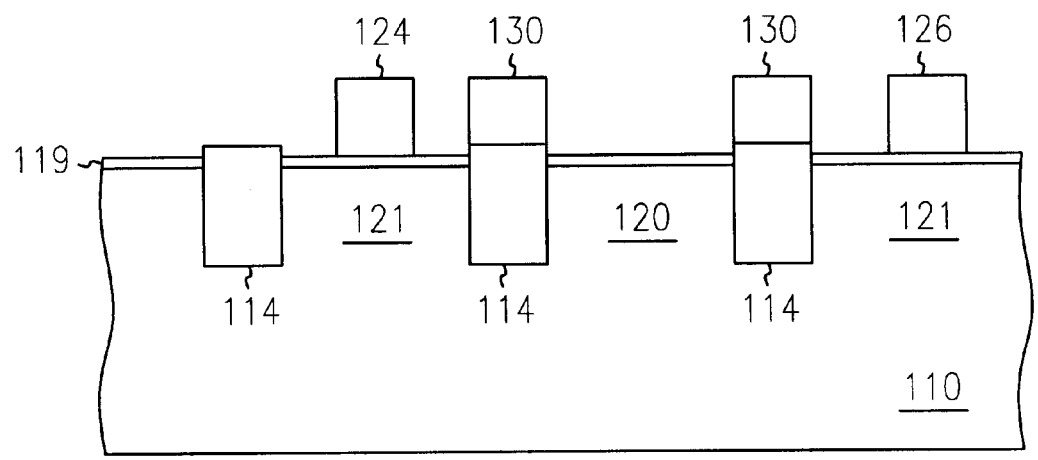

As shown in FIG. 4B, the polysilicon layer 122 is patterned as necessary to define desired gate electrodes 124 and 126 and to leave polysilicon structure 130 on top of some of the shallow trench region features 114. Thus, a polysilicon etch mask is used to pattern photoresist located above the shallow trench features to protect these areas during subsequent etching operations. By patterning the polysilicon layer such that polysilicon remains over the shallow trench region features, oxide byproducts from the trench features are not contributed during the polysilicon etch process. That is, the gate oxide regions are exposed during a polysilicon etch process while some of the shallow trench regions remain covered. Determining an end point for the etch process, therefore, is now dependent upon reaching the gate oxide layer and not dependent upon a height of the shallow trench region features. As such, it is not necessary to extend the etch duration beyond the time when the byproduct indicates that oxide has been reached. It will be appreciated that some shallow trench regions may have overlying polysilicon removed due to spacing concerns. The polysilicon layer, however, is patterned to reduce exposure of the shallow trench regions during the polysilicon etch operation. Although each circuit design is unique, it is anticipated that trench regions adjacent to dummy active areas 120 will remain covered by polysilicon.

The above described process increases the amount of gate oxide exposed during the polysilicon gate etch process while reducing the amount of shallow trench region features exposed during the etch process. An additional benefit of improving planarity of a subsequent dielectric layer is achieved by masking the polysilicon gate layer in a manner which leaves polysilicon material on the shallow trench region features.

An integrated circuit has been described which is fabricated with a layer of polysilicon located on top of shallow trench regions. The polysilicon is patterned so that the trench features are not exposed during an etching operation performed on the polysilicon layer. A method of improving gate electrode fabrication, therefore, is provided by reducing etch byproducts contributed by the STR features.

Although specific embodiments have been illustrated and described herein, it will be appreciated by those of ordinary skill in the art, having the benefit of the present disclosure, that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A method of forming transistor gate electrodes, the method comprising:

fabricating a plurality of shallow trench region features in a substrate, the shallow trench region features having a periphery;

fabricating a layer of gate oxide over the substrate;

fabricating a layer of polysilicon over the layer of gate oxide; and selectively removing portions of the layer of polysilicon such that polysilicon material remains over the layer of gate oxide to form the transistor gate electrodes, and polysilicon material covers the plurality of shallow trench region features to the periphery thereof.

2. The method of claim 1 wherein the portions of the layer of polysilicon are selectively removed using an etch process.

3. The method of claim 2 wherein the etch process is terminated when the layer of gate oxide is exposed.

4. The method of claim 2 wherein the etch process comprises:

monitoring byproducts of the polysilicon layer removed during the etch process; and terminating the etch process based upon a composition of the byproducts during the etch.

5. The method of claim 1 wherein the plurality of shallow trench region features comprise an oxide material.

6. A method of fabricating an integrated circuit, the method comprising:

fabricating a plurality of shallow trench region features in a substrate, the shallow trench region features having a periphery;

fabricating a layer of oxide over the substrate;

fabricating a layer of polysilicon over the layer of oxide and the plurality of shallow trench region features;

selectively etching portions of the layer of polysilicon such that polysilicon material protects the plurality of shallow trench region features to the periphery thereof from the etching;

monitoring byproducts of the polysilicon layer removed during the etch; and terminating the etch based upon a composition of the material removed during the etch.

7. The method of claim 6 wherein selectively etching portions of the layer of polysilicon is performed such that polysilicon material remains over the layer of oxide to form transistor gate electrodes.

8. The method of claim 6 wherein the layer of oxide and the plurality of shallow trench region features comprise substantially the same composition.

9. The method of claim 6 wherein selectively etching portions of the layer of polysilicon comprises using an etch mask to protect the polysilicon material over the plurality of shallow trench region features.

10. A method of fabricating an integrated circuit, the method comprising:

fabricating a plurality of shallow trench region features in a substrate, the shallow trench region features having a periphery;

fabricating a layer of oxide over the substrate;

fabricating a conductive layer over the layer of oxide and the plurality of shallow trench region features;

selectively etching portions of the conductive layer such that conductive material protects the plurality of shallow trench region features to the periphery thereof from the etching;

monitoring byproducts of the conductive layer removed during the etch; and terminating the etch based upon a composition of the material removed during the etch.

11. The method of claim 10 wherein selectively removing portions of the conductive layer is performed such that conductive material remains over the layer of oxide to form transistor gate electrodes.

12. The method of claim 10 wherein the layer of oxide and the plurality of shallow trench region features comprise substantially the same composition.

13. The method of claim 10 wherein selectively etching portions of the conductive layer comprises using an etch mask to protect the conductive material over the plurality of shallow trench region features.

14. The method of claim 10 wherein the conductive layer is polysilicon.

15. The method of claim 10 wherein the conductive layer comprises either tungsten or tantalum.

16. A method of fabricating an integrated circuit, the method comprising:

fabricating a plurality of shallow trench region features in a substrate, the shallow trench region features having a periphery;

fabricating a layer of oxide over the substrate;

fabricating a layer of polysilicon over the layer of oxide and the plurality of shallow trench region features;

selectively etching portions of the layer of polysilicon such that polysilicon material remains over the plurality of shallow trench region features to the periphery thereof;

monitoring byproducts of the polysilicon layer removed during the etch; and terminating the etch based upon a composition of the material removed during the etch;

wherein selectively etching portions of the layer of polysilicon comprises using an etch mask to protect the plurality of shallow trench region features.

17. The method of claim 16 wherein selectively etching portions of the layer of polysilicon is performed such that polysilicon material remains over the layer of oxide to form transistor gate electrodes.

18. The method of claim 16 wherein the layer of oxide and the plurality of shallow trench region features comprise substantially the same composition.

* * * * *